United States Patent
Calvert et al.

(10) Patent No.: US 10,976,659 B2
(45) Date of Patent: Apr. 13, 2021

(54) PHOTORESISTS COMPRISING NOVOLAK RESIN BLENDS

(75) Inventors: Jeffrey M. Calvert, Acton, MA (US); Joseph F. Lachowski, Sutton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/011,534

(22) Filed: Jan. 28, 2008

(65) Prior Publication Data

US 2008/0182204 A1 Jul. 31, 2008

Related U.S. Application Data

(60) Provisional application No. 60/897,982, filed on Jan. 26, 2007.

(51) Int. Cl.
*G03F 7/023* (2006.01)
*G03F 7/38* (2006.01)

(52) U.S. Cl.
CPC .......... *G03F 7/0236* (2013.01); *G03F 7/023* (2013.01); *G03F 7/38* (2013.01)

(58) Field of Classification Search
CPC .......... G03F 7/0236; G03F 7/023; G03F 7/38
USPC .......... 430/190, 191, 192, 193, 326
See application file for complete search history.

(56) References Cited

U.S. PATENT DOCUMENTS 5,266,440 A * 11/1993 Zampini .............. 430/192
5,709,977 A * 1/1998 Tan et al. .............. 430/192
5,723,254 A * 3/1998 Zampini et al. .............. 430/190

* cited by examiner

*Primary Examiner* — John S Chu
(74) *Attorney, Agent, or Firm* — Mintz Levin Cohn Ferris Glovsky and Popeo, P.C.; Peter F. Corless

(57) ABSTRACT

Photoresist compositions are provided comprising a radiation sensitive component and at least two distinct novolak resins. In one aspect, photoresists of the invention exhibit notably high dissolution rates, such as in excess of 800 angstroms per second in aqueous developer solution. In another aspect, photoresists of the invention can exhibit good photospeeds, such as 100 mJ/cm$^2$ or less.

4 Claims, No Drawings

PHOTORESISTS COMPRISING NOVOLAK RESIN BLENDS

The present invention relates to photoresist compositions comprising a radiation sensitive component and at least two distinct novolak resins. In one aspect, photoresists of the invention exhibit notably high dissolution rates, such as in excess of 800 angstroms per second in aqueous developer solution. In another aspect, photoresists of the invention can exhibit good photospeeds, such as 80 mJ/cm$^2$ or less.

Radiation sensitive compositions include photoresist compositions which are well known in the art and described in numerous publications including DeForest, Photoresist, Materials and Processes, McGraw-Hill Book Company, New York, 1975. Photoresists comprise coatings produced from solution or applied as a dry film which, when exposed to radiation of an activating wavelength, are chemically altered in their solubility to certain solvents. Photoresists can be negative-acting or positive-acting.

Positive-working resists may in general comprise a radiation sensitive compound and a film forming resin component. For many photoresists including those exposed with 365 nm (so-called i-line) or 435 nm radiation (so-called g-line), the radiation sensitive compounds include o-quinone diazide sulfonic and carboxylic acids, often referred to as "DNQ" photoactive compounds. For flat panel display applications, 405 nm radiation (so-called h-line) and broad band radiation (may include e.g. combinations of two or more of g-line, I-line and/or h-line) may be utilized.

Electronic device manufacturers consistently seek higher photoresist performance, including targeted dissolution rates in alkaline developer compositions as well as photospeed. Photospeed can be defined as the exposure time coupled with the exposure energy required to activate the photoactive component, e.g. to generate the required amount of photoacid to provide the desired solubility differential between exposed and unexposed areas of a photoresist coating layer. It can be important that a resist's photospeed is within an acceptable value to permit desired processing of the resist. For instance, sufficiently high photospeed is important in many processes, e.g. where a number of exposures are needed such as in generating multiple patterns by a step and repeat process, or where activating energy of reduced intensity is employed.

It thus would be desirable to have new photoresist compositions. It would be particularly desirable to have new photoresists that exhibit good dissolution rate and photospeed characteristics.

In one aspect, new photoresist compositions are provided that comprise (i) a radiation sensitive component such as a diazo-naphthoquinone material and (ii) at least two distinct novolak resins, wherein the photoresist exhibits a dissolution rate in aqueous alkaline developer of 800 angstroms per second or more.

In a further aspect, new photoresist compositions are provided that comprise (i) a radiation sensitive component such as a diazo-naphthoquinone material and (ii) at least two distinct novolak resins, wherein the photoresist exhibits a photospeed of 100 mJ/cm$^2$ or less.

In a yet further aspect, new photoresist compositions are provided that comprise (i) a radiation sensitive component such as a diazo-naphthoquinone material and (ii) at least two distinct novolak resins, wherein the photoresist exhibits (a) a dissolution rate in aqueous alkaline developer of 800 angstroms per second or more and (b) a photospeed of 100 mJ/cm$^2$ or less.

Preferred novolak resins of photoresists of the invention include cresol reaction products as well as resins that are reaction products of benzaldehyde and/or salicylaldehyde. In a particular embodiment, a photoresist of the invention may comprise (i) a first resin that is a reaction product of materials comprising one or more cresols (e.g. o-cresol, m-cresol and/or p-cresol) and (ii) a second resin that is a reaction product of materials comprising benzaldehyde and/or salicylaldehyde.

Preferred photoactive components of photoresists of the invention include diazo naphthoquinone materials, including polymeric and non-polymeric diazonaphthoquinone photoactive compounds.

We have surprisingly found that preferred photoresists of the invention can exhibit good dissolution rates, such as a dissolution rate (as defined herein) of 800 angstroms or more in an aqueous alkaline developer solution, preferably a 0.26 N aqueous alkaline developer solution. Particularly preferred photoresists of the invention may exhibit a dissolution rate (as defined herein) of 800 to 3500 angstroms per second, more preferably from 1000 to 3000 angstroms per second, still more preferably from about 1200 or 1500 angstroms to 2900 or 3000 angstroms per second. Photoresists having dissolution rates in excess of 3200, 3300 or 3400 or less can be preferred for at least certain applications.

As referred to herein, "dissolution rate" or other similar term of a photoresist composition refers to a dissolution rate as determined by the following protocol: 1) a resin blend of a photoresist composition is spin coated onto a substrate and soft baked (90° C. for 1 minute) to remove solvent to provide a dried coating layer thickness of about 10,000 angstroms; and 2) an aqueous developer composition is then applied and dissolution rate is measured using a dissolution rate monitor. For the developer composition, preferably a 0.26 N aqueous alkaline composition is used, such as a 0.26 N tetramethyl ammonium hydroxide aqueous developer composition. The dissolution rate of the resin blend is suitably determined in the absence of a photoactive component. For dissolution rate determination, a commercial dissolution rate monitor can be employed, such as the thin film analyzer (TFA-11) available from Luzchem in Ontario Canada.

We also have found that preferred photoresists of the invention can exhibit good photospeed values, such as photospeeds (as defined herein) at 365 nm of 100 mJ/cm$^2$ or less, including 80 mJ/cm$^2$ or less, 70 mJ/cm$^2$ or less, 60 mJ/cm$^2$ or less or 50 mJ/cm$^2$, less, 40 mJ/cm$^2$ or less, 30 mJ/cm$^2$ or less or 20 mJ/cm$^2$ or less. Certain particularly preferred photoresists of the invention may have photospeeds from 20 mJ/cm$^2$ to 80 mJ/cm$^2$, or from 25 mJ/cm$^2$ to 50 mJ/cm$^2$ or 60 mJ/cm$^2$.

The photospeed of a resist of the invention can be determined by procedures well known to those in the art, such as the procedure disclosed in U.S. Pat. No. 4,618,223 to Hertlein. As referred herein, "photospeed" of a photoresist is determined by the following protocol: 1) a photoresist composition is spin coated onto a substrate and soft baked (90° C. for 1 minute) to remove solvent to provide a dried coating layer thickness of about 10,000 angstroms; 2) the dried photoresist coating layer is open-frame exposed to activating radiation (particularly 365 nm) at varying exposure energies; 3) the exposed coating layer is post-exposure baked at 120° C. for 90 seconds; and 4) the exposed, baked photoresist coating layer is developed in 0.26N teretamethyl ammonium hydroxide developer solution for 60 seconds to determine the minimum exposure energy required to provide photoresist clearance (scanning electron micrograph) of photoresist residues in exposed areas following such development. That minimum exposure energy required to provide photoresist clearance is then determined to be the photospeed for the resist.

Photoresist compositions of the invention may be used for a variety of applications and are particularly useful for the manufacture of electronic devices, including flat panel displays (where the photoresist may be coated onto a glass substrate or indium tin oxide layer) and semiconductor devices (where the photoresist may be coated onto a silicon wafer substrate). Photoresist composition may be imaged with a variety of exposure radiation, including exposure radiation having a wavelength of 365 nm (i-line) or 435 nm (g-line) or 405 nm radiation (h-line) or broad band radiation (may include e.g. combinations of two or more of g-line, I-line and/or h-line).

Other aspects of the invention are disclosed infra.

As described above, the invention is directed to photoresist compositions that comprise a radiation sensitive component and a resin blend. The resin blend comprises an admixture of at least two distinct novolak resins.

Novolak resins are typically formed from the condensation of one or more phenols and an aldehyde in the presence of strong acid and a divalent sulfur compound as catalyst. Phenols useful in the practice of the invention include phenols of the type conventionally used in the formation of novolak resins such as phenols, cresols, xylenols, resorcinols, naphthols and bisphenols. Preferred phenols include o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid, p-nitro phenol, 2,6-bis(hydroxymethyl)-p-cresol and the like.

As discussed above, particularly preferred phenols for a first resin of the resin blend include the cresols, such as polymers made by polymerization of meta-cresol and para-cresol with optional co-polymerization of additional monomers such as xylenol. Particularly preferred reagents for polymerization of a second resin of a resin blend include benzaldehydes and salicylaldehydes.

Condensation reactions which can be employed to prepare useful novolak resins include art recognized techniques as described above and disclosed, for example, in U.S. Pat. Nos. 3,148,983; 4,404,357; 4,115,128; 4,377,631; and 4,423,138. See also the procedures disclosed in U.S. Pat. No. 5,302,490.

To achieve higher dissolution rates, lower molecular weight resins may employed, e.g. novolak resins having a molecular weight (weight average) of less than 5000, or less than 4000, or less than 3000, or less than 2000. Resins having molecular weights (weight average) of less than 1500 or 1000 may be less preferred. Lower molecular weight resins may be prepared e.g. by utilizing a relatively reduced amount of formaldehyde reagent in a resin synthesis.

Radiation sensitive components useful in photoresist compositions of the invention may be any of the various radiation sensitive compounds known to be suitable as sensitizers in photoresists comprising an alkali soluble polymer binder. Examples of such compounds include esters and amides formed from o-quinone diazide sulfonic and carboxylic acids. Additionally, sulfonic amide sensitizers and aromatic azide sensitizers may be used. Preferred sensitizers include esterified diazo naphthoquinone compounds, including triesterfied diazo naphthoquinone compounds. Specifically preferred sensitizers include the 2,1,4-diazonaphthoquinone sulfonic esters and the 2,1,5-diazonaphthoquinone sulfonic acid esters. Other naphthoquinone diazide sulfonic acid esters suitable as sensitizers in the compositions of the invention are disclosed in Kosar, Light Sensitive Systems, John Wiley & Sons, 1965, pp. 343 to 352.

For some preferred photoresist compositions, a polymeric photoactive component may be employed, e.g. where one or more diazo naphthoquinone groups are covalently linked to an ester or other resin. In certain preferred photoresist compositions, such a polymeric photoactive compound also may be used in combination with one or more non-polymeric photoactive compounds.

The amount of the photoactive compound(s) used and the manner of preparing the radiation sensitive composition is in accordance with art recognized procedures. In this respect, for many applications, photoactive compound(s) can suitably vary from 0.1 to 50 weight percent of the photoresist composition and preferably varies between from about 5 and 25 percent by weight of the photoresist composition.

The photoresists of the invention optionally may include one or more surfactants to avoid striations in a coating layer of the composition. Suitable surfactants are those generally known in the art and include, for example, Silwet surfactant-L7604.

Other suitable optional additives for photoresists of the invention include adhesion promoters including polymers such as polyvinyl ethyl ether and/or siloxane materials and various dyes such as Sudan Orange.

The various components of photoresists of the invention may be employed in varying amounts. For instance, in certain preferred photoresists, resin components (novolak resins and DNQ-resin, referred to as "resin components" below) may be employed in relative weight amounts as follows: 1) cresol novolak resin: 50 to 65 weight percent, 2) benzaldehyde and/or salicylaldehyde resin: 5 to 30 weight percent, and 3) photoactive resin: 10 to 30 weight percent. Additional non-polymeric photoactive compounds if employed may be suitably in relatively lower amounts e.g. 1 to 10 weight percent relative to those resin components. Optional additives such as surfactants and adhesion promoters may be used in relatively small amounts such as 0.5 to 3 weight percent each relative to those resin components.

Photoresists of the invention may be suitably prepared by admixing resin and photoactive components and dissolving those materials in one or more suitable solvents such as, for example, ethyl lactate, anisole, amyl acetate, propylene glycol monomethyl ether acetate, propylene glycol monomethyl ether, methyl methoxypropionate, and/or 2-haptanone, and others. The solids content of the composition can vary widely, for example, the solids can vary from between about 5 and 65 percent by weight of the total weight of the photoresist composition.

Photoresist compositions of the invention may be suitably used in accordance with generally known procedures for processing photoresists. Photoresists of the invention may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The compositions of the invention are applied to substrates conventionally used in processes involving coating with photoresists. For example, a composition of the invention may be applied over silicon or silicon dioxide wafers for the production of microprocessors and other integrated circuit components. Aluminum-aluminum oxide and silicon nitride wafers can also be coated with the photocurable compositions of the invention. Another suitable use of the compositions of the invention is as a planarizing layer or for formation of multiple layers in accordance with art recognized procedures.

As discussed above, in preferred aspects, as discussed above, photoresists may be used in the fabrication and processing of flat panel display substrates, e.g. a photoresist composition may be suitably coated onto a glass substrate or indium tin oxide layer.

Following coating of the resist onto a surface, it is dried by heating to remove the solvent until preferably the resist coating is tack free. Thereafter, it is imaged through a mask in conventional manner. The exposure is sufficient to effectively activate the photoactive component of the photoresist system to produce a patterned image in the resist coating layer. Optimal exposure energies have been discussed above.

Following exposure, the film layer of the composition may be baked if necessary and, thereafter, the film is developed. The exposed resist film can be developed with an alkaline aqueous based developer such as a quaternary ammonium hydroxide solution.

The developed substrate may then be selectively processed on those substrate areas bared of resist, for example chemically etching or plating substrate areas bared of resist in accordance with procedures known in the art. Suitable etchants include e.g. a plasma gas etch and a hydrofluoric acid etching solution. After such processing, resist may be removed from the processed substrate using known stripping procedures.

The following examples are illustrative of the invention.

EXAMPLE 1

Photoresist Composition Preparation and Lithographic Processing

A photoresist composition was prepared by admixing the following materials in amounts specified below:
Resin Component
(2,5-xylenol)-(m-cresol)-(p-cresol)formaldehyde resin
benzaldehyde-salicylaldehyde novolak resin
Photoactive Component
Diazonaphthoquinone ester of benzaldehyde-salicylaldehyde novolak resin glycouril resin
2,1,4-diazonaphthoquinone (non-polymeric)
Additives
Leveling Agent of Silwet
Adhesion promoter of polyvinyl ethyl ether
Solvent
Ethyl lactate
Amyl acetate
Anisole The (2,5-xylenol)-(m-cresol)-(p-cresol) formaldehyde resin was prepared from a monomer charge of p-cresol 65 weight percent, m-cresol 34.5 weight percent and xylenol 2.5 weight percent. The three components ("resin solids") of 1) (2,5-xylenol)-(m-cresol)-(p-cresol) formaldehyde resin, 2) benzaldehyde-salicylaldehyde novolak resin and 3) diazonaphthoquinone ester of benzaldehyde-salicylaldehyde novolak resin glycouril resin were present in the photoresist composition in the following relative weight percent based on total weight of these resin solids: 1) cresol resin—59%, 2) benzaladehyde resin—15%, 3) DNQ resin—26%. The 2,1,4-diazonaphthoquinone was present in the photoresist composition in 3 weight percent relative to resin solids. The leveling agent and adhesion promoter were both present in the photoresist composition in amounts of 1 weight percent each relative to the resin solids.

The photoresist composition was spin-coated onto a wafer substrate, soft-baked to remove solvent, exposed to 365 nm radiation and developed with 0.26 N alkaline aqueous developer. The photoresist provided good quality relief images. Photospeed of the resist composition 54 mJ/cm$^2$ for 365 nm radiation.

What is claimed is:

1. A photoresist composition comprising:
   (i) (a) a radiation sensitive component comprising a polymeric diazo-naphthoquinone material and (b) a non-polymeric diazonaphthoquinone photoactive compound; and
   (ii) at least two distinct novolak resins that comprise 1) a cresol-formaldehyde reaction product and 2) a reaction product of benzaldehyde and/or salicylaldehyde, wherein both of the two distinct novolak resins have a molecular weight (weight average) of less than 2000 but not less than 1000,
   wherein the photoresist exhibits a photospeed of 100 mJ/cm$^2$ or less, and
   wherein the at least two distinct novolak resins comprise (a) 50 to 65 wt % cresol reaction product based on total weight of the novolak resins and polymeric diazo-naphthoquinone material and (b) 5 to 30 wt % benzaldehyde and/or salicylaldehyde resin based on total weight of the novolak resins and polymeric diazo-naphthoquinone material; and
   wherein the polymeric diazo-naphthoquinone material is present in an amount of 10 to 30 weight percent based on total weight of the novolak resins and polymeric diazo-naphthoquinone material.

2. The photoresist composition of claim 1, wherein the photoresist exhibits a dissolution rate of 800 angstroms per second or more in an aqueous alkaline developer solution.

3. A method of forming a photoresist relief image, comprising:
   (A) applying a photoresist composition on a semiconductor substrate,
   the photoresist composition comprising:
   (i) (a) a radiation sensitive component comprising a polymeric diazo-naphthoquinone material and (b) a non-polymeric diazonaphthoquinone photoactive compound; and
   (ii) at least two distinct novolak resins that comprise 1) a cresol reaction product and 2) a reaction product of benzaldehyde and/or salicylaldehyde, wherein both of the two distinct novolak resins have a molecular weight (weight average) of less than 2000 but not less than 1000,
   wherein the photoresist exhibits a photospeed of 100 mJ/cm$^2$ or less, and
   wherein the at least two distinct novolak resins comprise (a) 50 to 65 wt % cresol-formaldehyde reaction product based on total weight of the novolak resins and polymeric diazo-naphthoquinone material and (b) 5 to 30 wt % benzaldehyde and/or salicylaldehyde resin based on total weight of the novolak resins and polymeric diazo-naphthoquinone material;
   wherein the polymeric diazo-naphthoquinone material is present in an amount of 10 to 30 weight percent based on total weight of the novolak resins and polymeric diazo-naphthoquinone material;

(B) exposing and developing the photoresist layer to provide a resist relief image.

4. The method of claim 3 wherein the photoresist composition is exposed with radiation having a wavelength of 365 nm.

\* \* \* \* \*